(12) United States Patent
Teh et al.

(10) Patent No.: US 12,051,667 B2
(45) Date of Patent: Jul. 30, 2024

(54) HIGH DENSITY SUBSTRATE ROUTING IN PACKAGE

(71) Applicant: Intel Corporation, Santa Clara, CA (US)

(72) Inventors: Weng Hong Teh, Cambridge, MA (US); Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/373,849

(22) Filed: Sep. 27, 2023

(65) Prior Publication Data

US 2024/0021562 A1 Jan. 18, 2024

Related U.S. Application Data

(60) Continuation of application No. 17/570,255, filed on Jan. 6, 2022, now Pat. No. 11,810,884, which is a
(Continued)

(51) Int. Cl.
*H01L 23/538* (2006.01)
*H01L 23/00* (2006.01)
(Continued)

(52) U.S. Cl.
CPC .......... *H01L 24/25* (2013.01); *H01L 23/3107* (2013.01); *H01L 23/3114* (2013.01);
(Continued)

(58) Field of Classification Search
CPC . H01L 24/25; H01L 23/3107; H01L 23/3114; H01L 23/50; H01L 23/5389; H01L 24/19; H01L 24/24; H01L 25/16; H01L 25/18; H01L 21/568; H01L 23/3128; H01L 2224/04105; H01L 2224/12105; H01L 2224/16227; H01L 2224/2501; H01L 2224/2505; H01L 2224/2512; H01L 2224/255; H01L 2224/73209; H01L 2224/81005; H01L 2224/92133; H01L 2924/10253; H01L 2924/12042; H01L 2924/141; H01L 2924/1431; H01L 2924/1461; H01L 2924/15151;
(Continued)

(56) References Cited

U.S. PATENT DOCUMENTS 5,241,456 A 8/1993 Marcinkiewicz et al.
5,664,772 A 9/1997 Auerbach et al.
(Continued)

*Primary Examiner* — Elias Ullah
(74) *Attorney, Agent, or Firm* — Schwabe, Williamson & Wyatt, P.C.

(57) ABSTRACT

Discussed generally herein are devices that include high density interconnects between dice and techniques for making and using those devices. In one or more embodiments a device can include a bumpless buildup layer (BBUL) substrate including a first die at least partially embedded in the BBUL substrate, the first die including a first plurality of high density interconnect pads. A second die can be at least partially embedded in the BBUL substrate, the second die including a second plurality of high density interconnect pads. A high density interconnect element can be embedded in the BBUL substrate, the high density interconnect element including a third plurality of high density interconnect pads electrically coupled to the first and second plurality of high density interconnect pads.

20 Claims, 11 Drawing Sheets

Related U.S. Application Data continuation of application No. 17/077,996, filed on Oct. 22, 2020, now Pat. No. 11,251,150, which is a continuation of application No. 16/561,965, filed on Sep. 5, 2019, now Pat. No. 10,861,815, which is a continuation of application No. 16/239,670, filed on Jan. 4, 2019, now Pat. No. 10,438,915, which is a continuation of application No. 15/873,567, filed on Jan. 17, 2018, now Pat. No. 10,199,346, which is a continuation of application No. 15/255,351, filed on Sep. 2, 2016, now Pat. No. 9,929,119, which is a continuation of application No. 14/922,425, filed on Oct. 26, 2015, now Pat. No. 9,437,569, which is a continuation of application No. 14/663,689, filed on Mar. 20, 2015, now Pat. No. 9,171,816, which is a division of application No. 13/707,159, filed on Dec. 6, 2012, now Pat. No. 9,190,380.

(51) Int. Cl.
*H01L 23/31* (2006.01)
*H01L 23/50* (2006.01)
*H01L 25/16* (2023.01)
*H01L 25/18* (2023.01)
*H01L 21/56* (2006.01)

(52) U.S. Cl.
CPC .......... *H01L 23/50* (2013.01); *H01L 23/5389* (2013.01); *H01L 24/19* (2013.01); *H01L 24/24* (2013.01); *H01L 25/16* (2013.01); *H01L 25/18* (2013.01); *H01L 21/568* (2013.01); *H01L 23/3128* (2013.01); *H01L 2224/04105* (2013.01); *H01L 2224/12105* (2013.01); *H01L 2224/16227* (2013.01); *H01L 2224/2501* (2013.01); *H01L 2224/2505* (2013.01); *H01L 2224/2512* (2013.01); *H01L 2224/255* (2013.01); *H01L 2224/73209* (2013.01); *H01L 2224/81005* (2013.01); *H01L 2224/92133* (2013.01); *H01L 2924/10253* (2013.01); *H01L 2924/12042* (2013.01); *H01L 2924/141* (2013.01); *H01L 2924/1431* (2013.01); *H01L 2924/1461* (2013.01); *H01L 2924/15151* (2013.01); *H01L 2924/15192* (2013.01); *H01L 2924/15747* (2013.01); *H01L 2924/18161* (2013.01); *H01L 2924/18162* (2013.01)

(58) Field of Classification Search
CPC . H01L 2924/15192; H01L 2924/15747; H01L 2924/18161; H01L 2924/18162
See application file for complete search history.

(56) References Cited

U.S. PATENT DOCUMENTS

| | | |
|---|---|---|
| 6,008,821 A | 12/1999 | Bright et al. |
| 8,461,036 B2 | 6/2013 | Wu |
| 8,558,395 B2 | 10/2013 | Khan et al. |
| 8,823,144 B2 | 9/2014 | Khan et al. |
| 8,866,308 B2 | 10/2014 | Roy et al. |
| 9,171,816 B2 | 10/2015 | Teh |
| 9,190,380 B2 | 11/2015 | Teh |
| 9,437,569 B2 | 9/2016 | Teh |
| 2011/0228464 A1 | 9/2011 | Guzek et al. |
| 2012/0074580 A1 | 3/2012 | Nalla |
| 2013/0105962 A1 | 5/2013 | Alhayed |
| 2014/0091474 A1 | 4/2014 | Starkston et al. |
| 2014/0264791 A1 | 9/2014 | Manusharow et al. |
| 2015/0084210 A1 | 3/2015 | Chiu |
| 2016/0095207 A1 | 3/2016 | Taniguchi |
| 2016/0126110 A1 | 5/2016 | Yang |
| 2016/0197037 A1 | 7/2016 | Starkston |
| 2016/0247763 A1 | 8/2016 | Chiu |
| 2017/0125334 A1 | 5/2017 | Wang |
| 2017/0148737 A1 | 5/2017 | Fasano |
| 2018/0005945 A1 | 1/2018 | Pietambaram |
| 2018/0026008 A1 | 1/2018 | Jeng |
| 2018/0061741 A1 | 3/2018 | Beyne | ns set forth in the claims encompass all available equivalents of those claims.
HIGH DENSITY SUBSTRATE ROUTING IN PACKAGE

CLAIM OF PRIORITY

This application is a continuation of U.S. patent application Ser. No. 17/570,255, filed Jan. 6, 2022, which is a continuation of U.S. patent application Ser. No. 17/077,996, filed Oct. 22, 2020, now U.S. Pat. No. 11,251,150, issued Feb. 15, 2022, which is a continuation of U.S. patent application Ser. No. 16/561,965, filed Sep. 5, 2019, now U.S. Pat. No. 10,861,815, issued Dec. 8, 2020, which is a continuation of U.S. patent application Ser. No. 16/239,670, filed Jan. 4, 2019, now U.S. Pat. No. 10,438,915, issued Oct. 8, 2019, which is a continuation of U.S. patent application Ser. No. 15/873,567, filed Jan. 17, 2018, now U.S. Pat. No. 10,199,346, issued Feb. 5, 2019, which is a continuation of U.S. patent application Ser. No. 15/255,351, filed Sep. 2, 2016, now U.S. Pat. No. 9,929,119, issued Mar. 27, 2018, which is a continuation of U.S. patent application Ser. No. 14/922,425, filed Oct. 26, 2015, now U.S. Pat. No. 9,437,569, issued Sep. 6, 2016, which is a continuation of U.S. patent application Ser. No. 14/663,689, filed on Mar. 20, 2015, now U.S. Pat. No. 9,171,816, issued Oct. 27, 2015, which is a divisional of U.S. patent application Ser. No. 13/707,159, filed on Dec. 6, 2012, now U.S. Pat. No. 9,190,380, issued Nov. 17, 2015, all of which are hereby incorporated by reference in their entirety.

TECHNICAL FIELD

This disclosure relates generally to electronic chip architectures.

BACKGROUND ART

Semiconductor devices, such as electronic devices, can include substrate routing that is of a lower density than some of the routing in a chip that is attached to the substrate. Such devices can include complex routing schemes especially in areas where the attached chip includes higher density routing than the routing in the substrate.

DESCRIPTION OF THE EMBODIMENTS

Figure 1:
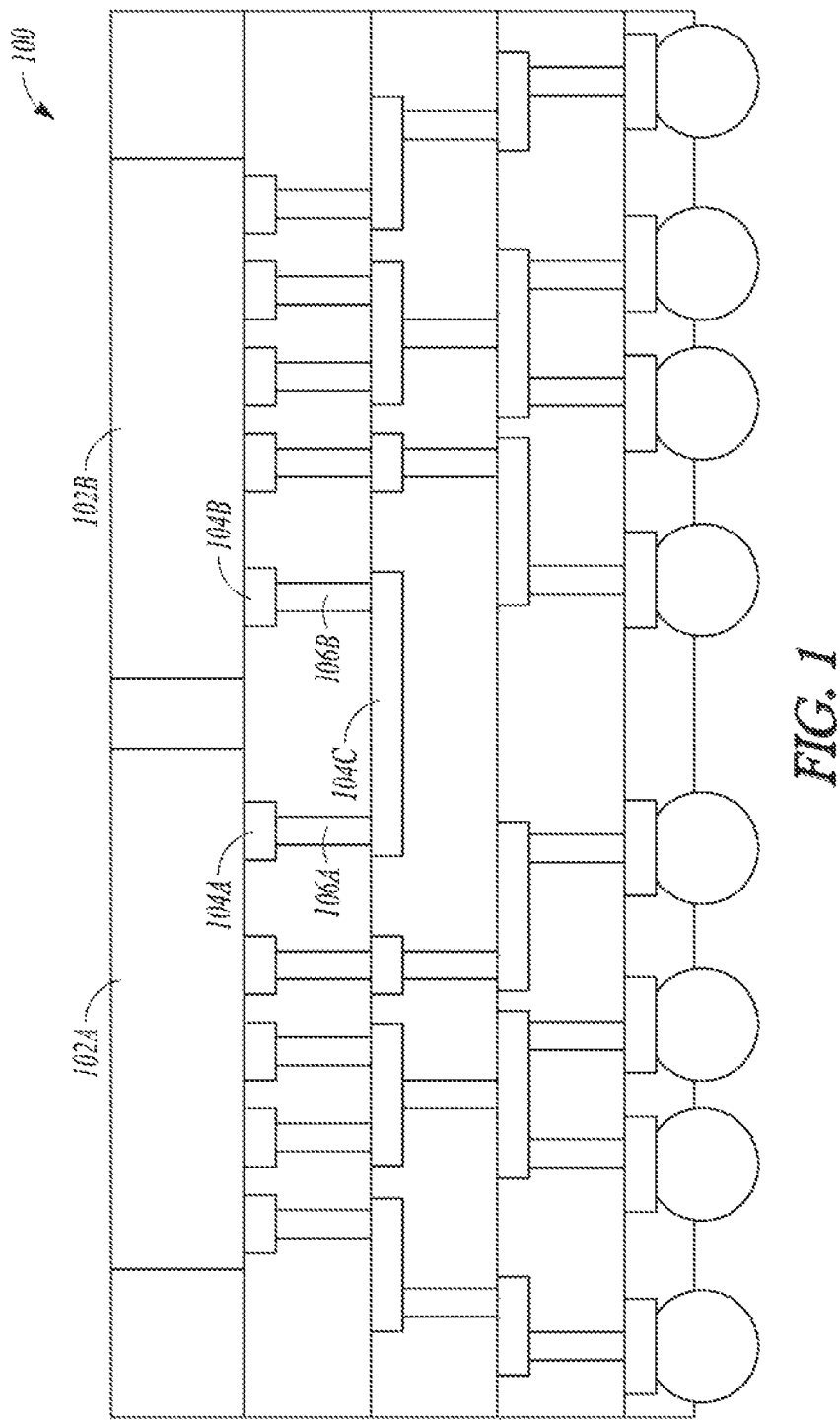
FIG. 1 shows a cross-section view of a BBUL substrate with two die electrically coupled through low density interconnects.

The following description and the drawings sufficiently illustrate specific embodiments to enable those skilled in the art to practice them. Other embodiments can incorporate structural, logical, electrical, process, or other changes. Portions and features of some embodiments can be included in, or substituted for, those of other embodiments. Embodiments set forth in the claims encompass all available equivalents of those claims.

Embodiments of a system and method for localized high density substrate routing in a bumpless buildup layer (BBUL) substrate are generally described herein. In one or more embodiments a device can include a bumpless buildup layer (BBUL) substrate including a first die at least partially embedded in the BBUL substrate, the first die including a first plurality of high density interconnect pads. A second die can be at least partially embedded in the BBUL substrate, the second die including a second plurality of high density interconnect pads. A high density interconnect element can be embedded in the BBUL substrate, the high density interconnect element including a third plurality of high density interconnect pads electrically coupled to the first and second plurality of high density interconnect pads.

Current board design can be created by incorporating a number of heterogeneous functions, picking individual packages that implement these functions, and designing the board around the packages chosen. This approach can increase the system board area, power loss, complexity, component count, or costs over an integrated solution.

The input/output (TO) density in a package substrate can be a function of a substrate's minimum pad size, minimum trace dimensions, minimum space dimensions, or the capability of the manufacturing process. The routing density in a multichip substrate can be several orders of magnitude lower than chip level routing density. This routing density can impact cost, size, and performance of a product.

A way to reduce the size of a product can include utilizing a silicon interposer in a package to provide a high density chip to chip interconnection. Such a solution can include a higher cost due to the cost of the silicon interposer, additional assembly and process steps, and compounding yield loss.

A substrate can include a high density interconnect bridge in a BBUL package or substrate with multiple embedded dice (e.g., chips) embedded, at least partially, therein. Such a solution can eliminate a first level interconnect (FLI) die attach and use panel processing to reduce the overall cost. Such a solution can allow a high density interconnect to be situated where it would be advantageous and allow low density interconnect (e.g., routing with a substrate routing technique) where it is desired.

Substrate routing can take up a significant amount of space and can be a factor in the overall size of a die package. By including typical substrate routing techniques, which can result in less dense routing than chip routing techniques, there may not be enough space to route the die without routing through the die. Integrating a high density interconnect element in a package or substrate, such as a BBUL package or substrate, can allow for an increase in overall local routing and interconnect density of a package, thus helping to reduce size and cost. These problems may be avoided by including a high density interconnect element in the substrate. In one or more embodiments, the high density interconnect element is a silicon die interconnect bridge. In one or more embodiments, the high density interconnect element is a glass die interconnect bridge. In one or more embodiments, the high density interconnect element is a different type of chip made using chip routing technology.

Referring now to FIG. 1, a BBUL package 100 with multiple embedded dice 102A-B can include low density substrate routing (e.g., routing accomplished using a substrate routing technique) and low density interconnect pads 104A-B (e.g., low density chip interconnects). The dice 102A-B can be electrically coupled through low density interconnect pads 104A-B that are electrically coupled through vias 106A-B which are electrically coupled through another low density interconnect pad 104C. Such an implementation can include up to about 23 interconnects/mm/layer.

Figure 2:
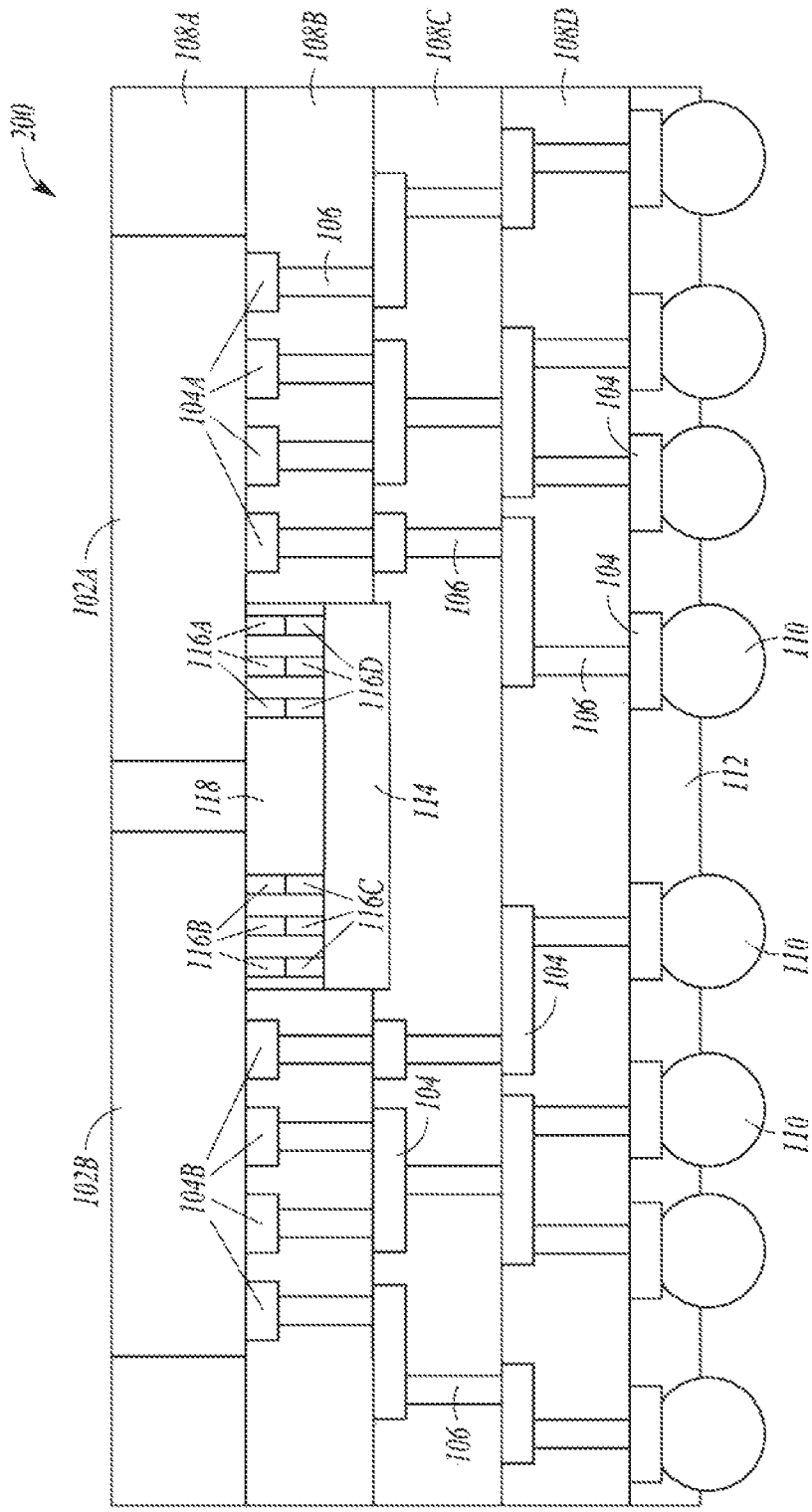
FIG. 2 shows a cross-section view of an example of a BBUL substrate with two die electrically coupled through a high density interconnect.
Figure 3:
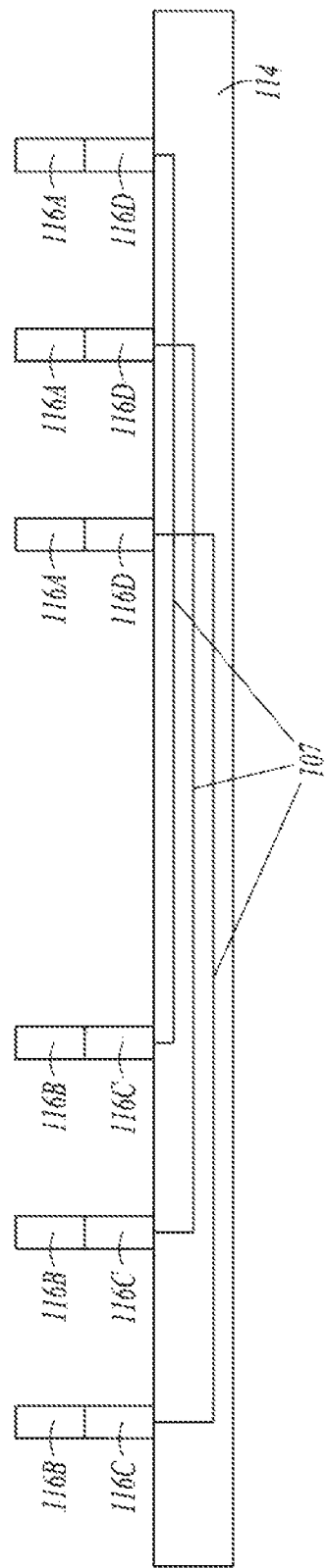
FIG. 3 show a cross-section view of an example of a high density interconnect element.

FIG. 2 shows an example of a BBUL substrate 200 with two dice 102A-B electrically coupled through a high density interconnect element 114. Each dice 102A-B can include a plurality of low density interconnect pads 104A-B, respectively, and a plurality a high density interconnect pads 116A-B, respectively. The high density interconnect pads 116A-B can be electrically coupled through high density interconnect pads 116C-D on the high density interconnect element 114. The high density interconnect element 114 can be routed to electrically couple a high density interconnect pad 116A on die 102A to a high density interconnect pad 116B on second die 102B. Such electrical coupling can be accomplished by coupling a high density interconnect pad 116B to a high density interconnect pad 116C, coupling the high density interconnect pad 116C to another high density interconnect pad 116D through a trace 107 in the high density interconnect element 114, and coupling the high density interconnect pad 116D to a high density interconnect pad 116A on the die 102A, such as shown in FIG. 3. Such an implementation can include up to about 250 interconnects/mm/layer.

The dice 102A-B can be analog or logic dice, or a mixture of analog and logic dice. An analog die is one that includes mostly analog components and a digital die is one that includes mostly logic gates and other logic components. The dice 102A-B can include a CPU, graphics, memory, radio, MicroElectroMechanical system (MEMS) sensor, or other type of circuitry.

The BBUL substrate 200 can include a plurality of vias 106 electrically coupling low density interconnect pads 104 between buildup layers 108A-D. The buildup layers 108 can include copper (Cu) interconnects and Ajinomoto dielectric buildup layers. The BBUL substrate can include a solder resist 112 situated on a fourth buildup layer 108D and between solder balls 110, or other electrically conductive interconnect elements.

FIGS. 4A-4G show a technique for embedding a high density interconnect element 114 in a BBUL substrate or package. A substrate carrier 120, such as a coreless carrier or a copper substrate carrier, can be formed. Die backside films 122A-B can be situated on a substrate carrier 120. The die backside films 122A-B can be situated using a dielectric lamination process. Dice 102A-B can be situated on the die backside films 122A-B, respectively. In one or more embodiments, a silicide can be formed on the substrate carrier 120 or the die 102 and the die 102 can be coupled to the substrate carrier 120 through the silicide. In one or more embodiments, an adhesive film is situated on a panel, the adhesive film is patterned to match a dice 102 footprint, and then dice 102 are situated on the adhesive film.

Figure 4A:
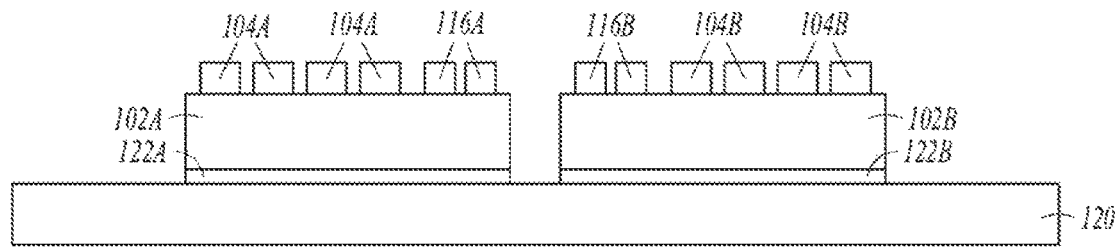
FIGS. 4A-4G show an example of a technique of making a BBUL substrate with two die electrically coupled through a high density interconnect.
Figure 4B:
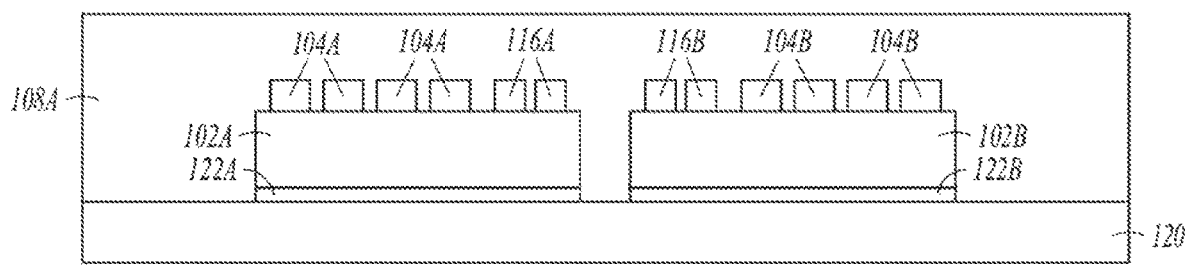
Figure 4C:
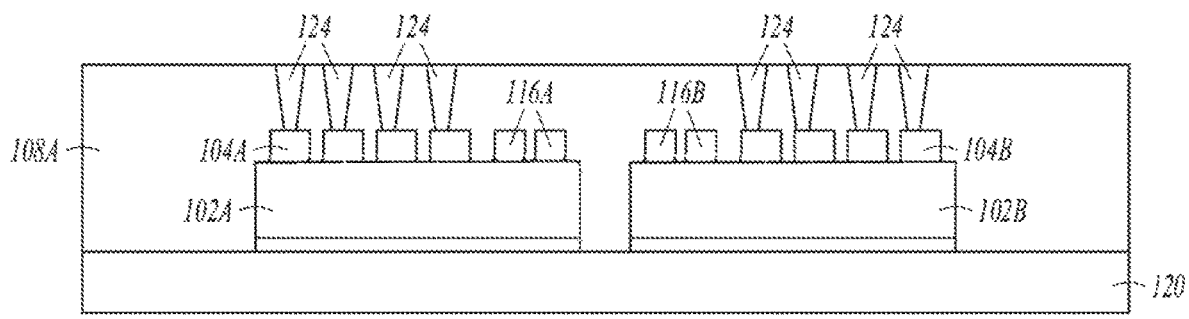

The first die 102A can include a plurality of low density interconnect pads 104A and a plurality of high density interconnect pads 116A. The second die 102B can include a plurality of low density interconnect pads 104B and a plurality of high density interconnect pads 116B, such as shown in FIG. 4A. FIG. 4B shows a buildup layer 108A situated over the substrate carrier 120 and on, over, or around the dice 102A-B. The first buildup layer 108A can cover the high density interconnect pads 116A-B and low density interconnect pads 104A-B. One or more via holes 124 can be formed in the buildup layer 108A, such as by laser drilling. The via holes 124 can be formed to expose one or more low density interconnect pads 104A-B, such as shown in FIG. 4C.

Figure 4D:
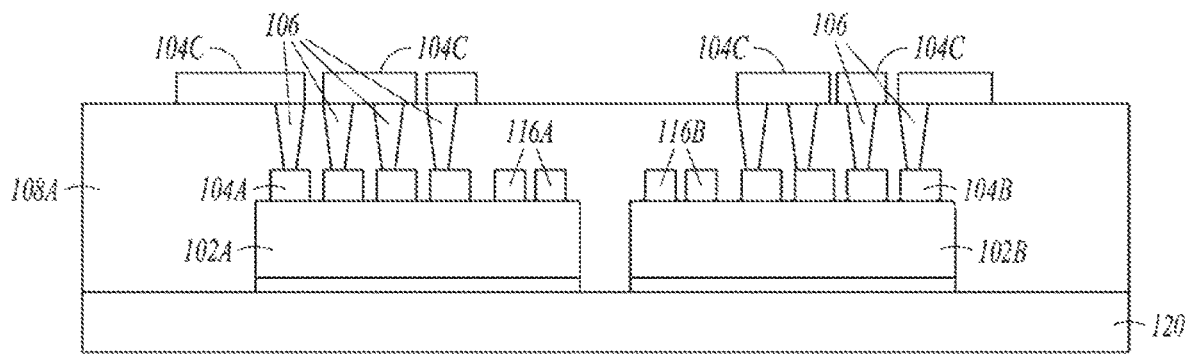

FIG. 4D shows the via holes 124 at least partially filled with a conductive material, such as copper, to form electrically conductive vias 106. Low density interconnect pads 104C can be situated on or over the vias 106. One or more of the low density interconnect pads 104C can electrically couple two or more of the low density interconnect pads 104A or 104B, such as shown in FIG. 4D. The via holes 124 can be filled and the low density interconnect pads 104C can be formed using a semi-additive lithographic or electroplating process. The low density interconnect pads 104C-E can act as a bus, such as a power, ground, or data bus.

Figure 4E:
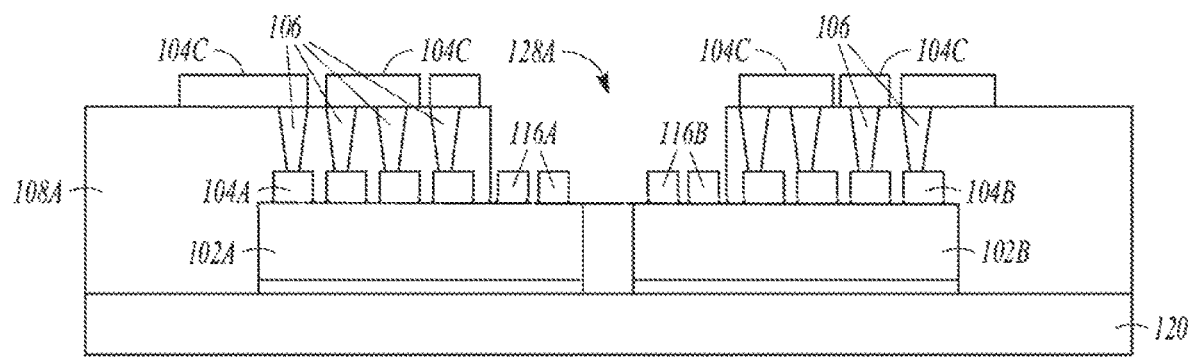
Figure 4F:
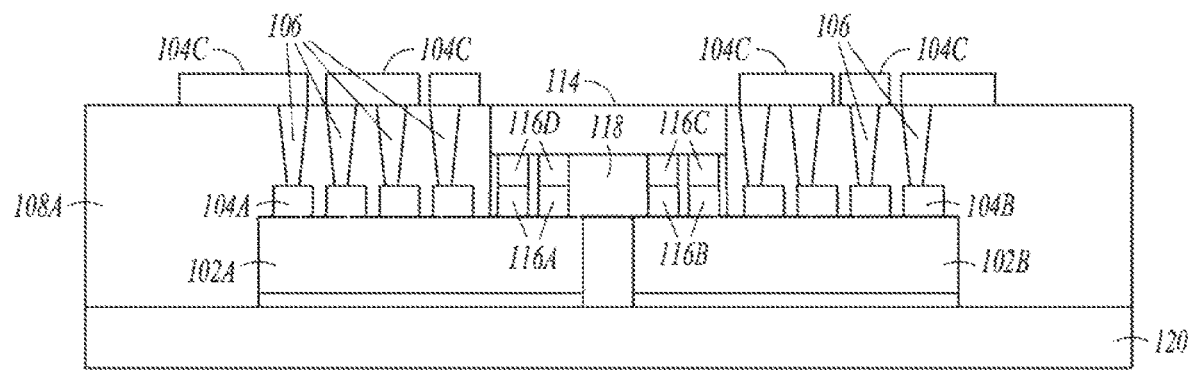

A cavity 128A can be formed in the buildup layer 108A, such as to expose high density interconnect pads 116A-B, such as shown in FIG. 4E. In one or more embodiments, the cavity 128 is between about 30 um and 150 um deep with a length of up to about 10 mm and a width of up to about 10 mm. Other length, width, and depth dimensions are possible. FIG. 4F shows a high density interconnect element 114 situated at least partially in the cavity 128A. The high density interconnect pads 116C can be electrically coupled to the high density interconnect pads 116A-B, such as shown in FIG. 4F. Such an electrical coupling can be created by depositing an epoxy flux and Thermal Compression Bonding (TCB) high density interconnect pads 116C to high density interconnect pads 116A-B (e.g., in situ epoxy TCB). Another technique of such electrical coupling includes using a TCB process to electrically couple high density interconnect pads 116C to high density interconnect pads 116A-B and filling gaps between the high density interconnect element 114 and the dice 102A-B and between high density interconnect pads 116A-C (e.g., in situ capillary underfill TCB). In one or more examples, the technique can include removing contaminants, such as oxide, before TCB.

Figure 4G:
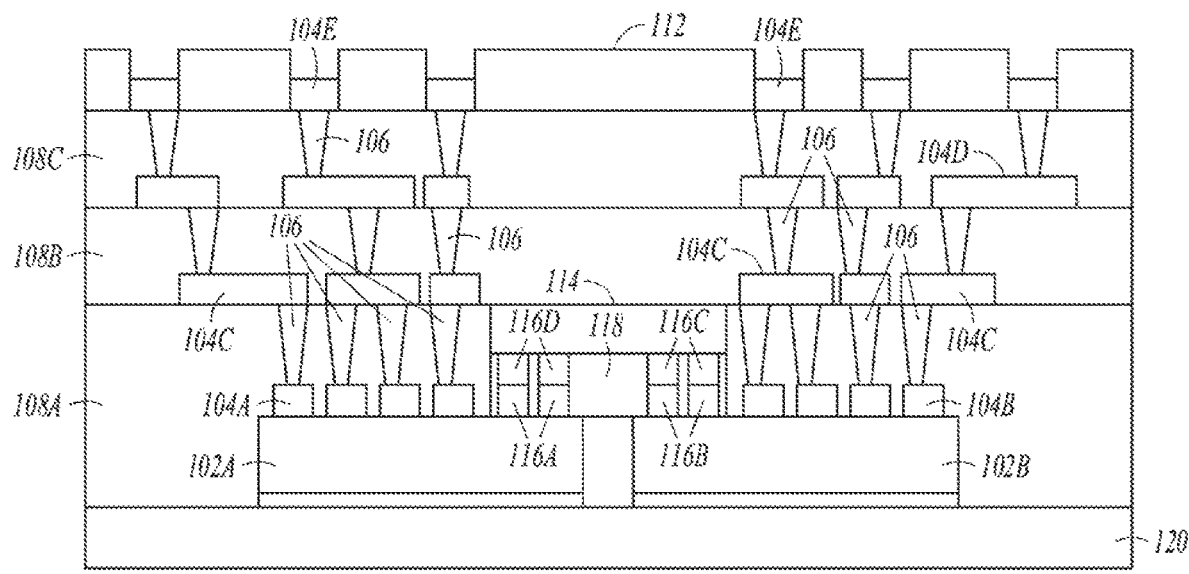

FIG. 4G shows second and third buildup layers 108B-C with vias 106 formed therein and low density interconnect pads 104D-E formed thereon. A layer of solder resist 112 can be formed on the third buildup layer 108C. The solder resist 112 can be situated so as to leave low density interconnect pads 104E exposed. Solder balls 110 can be formed on the low density interconnect pads 104E and the substrate carrier 120 can be removed. The resulting package can be similar to the BBUL substrate 200, depicted in FIG. 2.

Figure 5A:
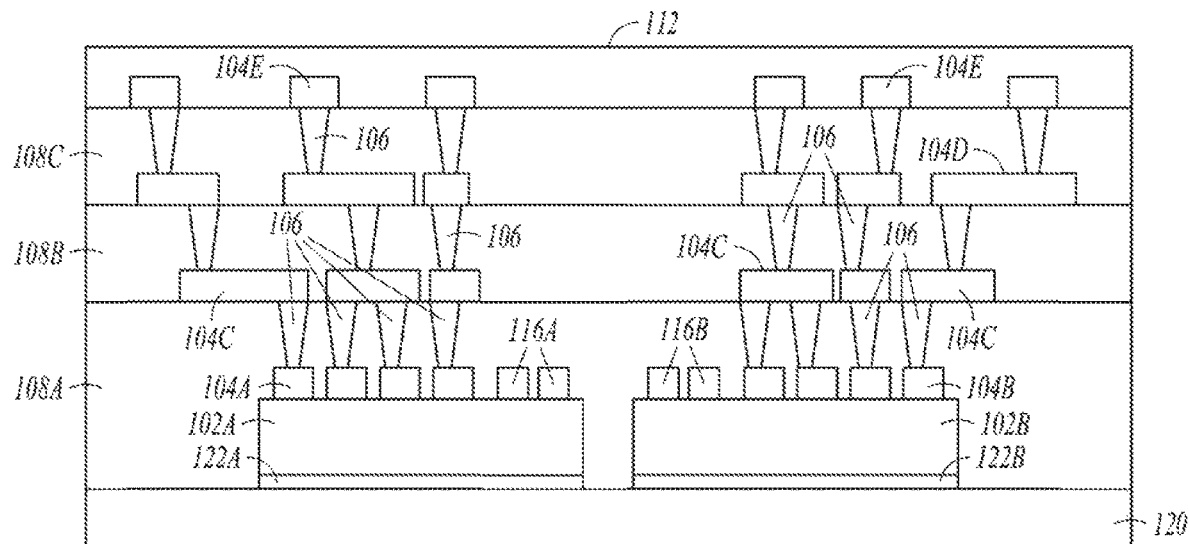
FIGS. 5A-5E show an example of another technique of making a BBUL substrate with two die electrically coupled through a high density interconnect.

FIGS. 5A-5E depict a technique for embedding a high density interconnect element 114 in a BBUL substrate or package. The technique can begin with a process substantially similar to the process shown in FIGS. 4A-4D. FIG. 5A depicts the partial substrate of FIG. 4D with second and third buildup layers 108B-C formed over the first buildup layer 108A. The second and third buildup layers 108B-C can include vias 106 formed therein and low density interconnect pads 104D-E formed thereon. A layer of solder resist 112 can be formed on the third buildup layer 108C, such as shown in FIG. 5A.

Figure 5B:
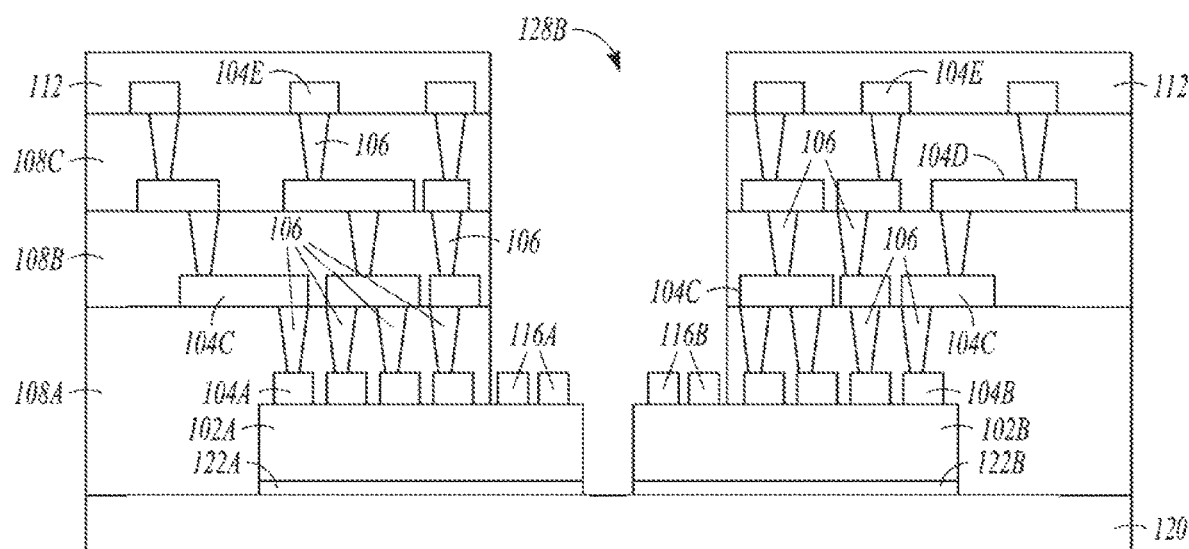

A cavity 128B can be formed by removing a portion of the solder resist 112, first buildup layer 108A, second buildup layer 108B, and third buildup layer 108C, such as cavity 128B shown in FIG. 5B. Such a process can expose high density interconnect pads 116A-B. Removing the portion of the solder resist 112, first buildup layer 108A, second buildup layer 108B, and third buildup layer 108C can be accomplished using a sandblasting or laser ablation process.

The sandblasting can include dry film resist patterning with an optional etch stop at a passivation layer of the high density interconnect pads 116A-B or the dice 102. The laser ablation can include laser skiving, laser projection printing, or laser pulsing. In one or more examples, sandblasting or laser ablation can be used to remove a majority of material to be removed (e.g., portions of one or more buildup layers or solder resist) and a selective etch (e.g., plasma ashing, wet etching, microwave plasma etching) can be used to remove the remainder of the material to be removed.

Figure 5C:
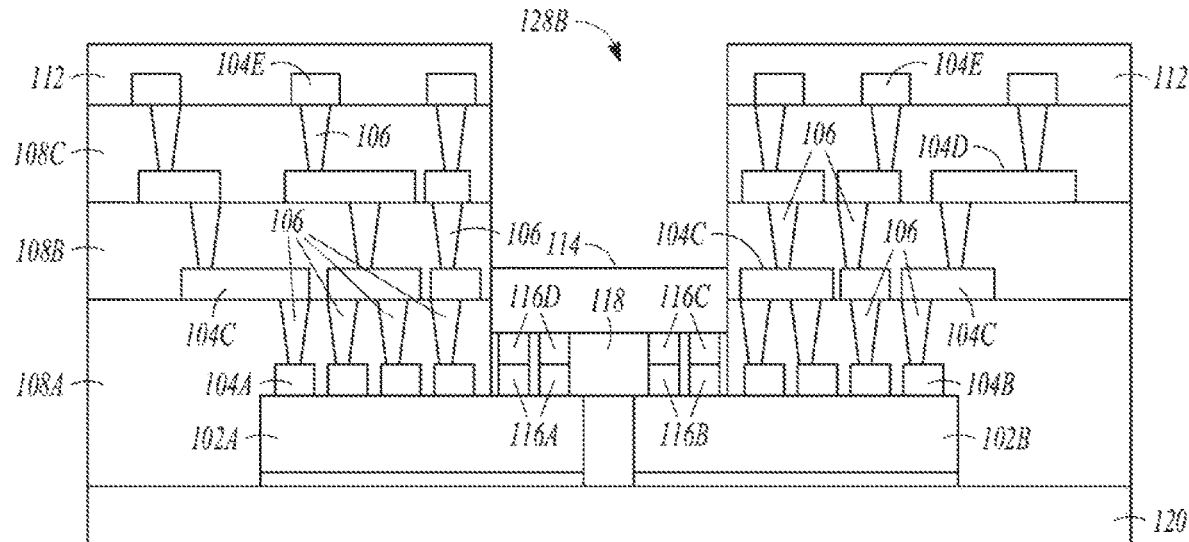
Figure 5D:
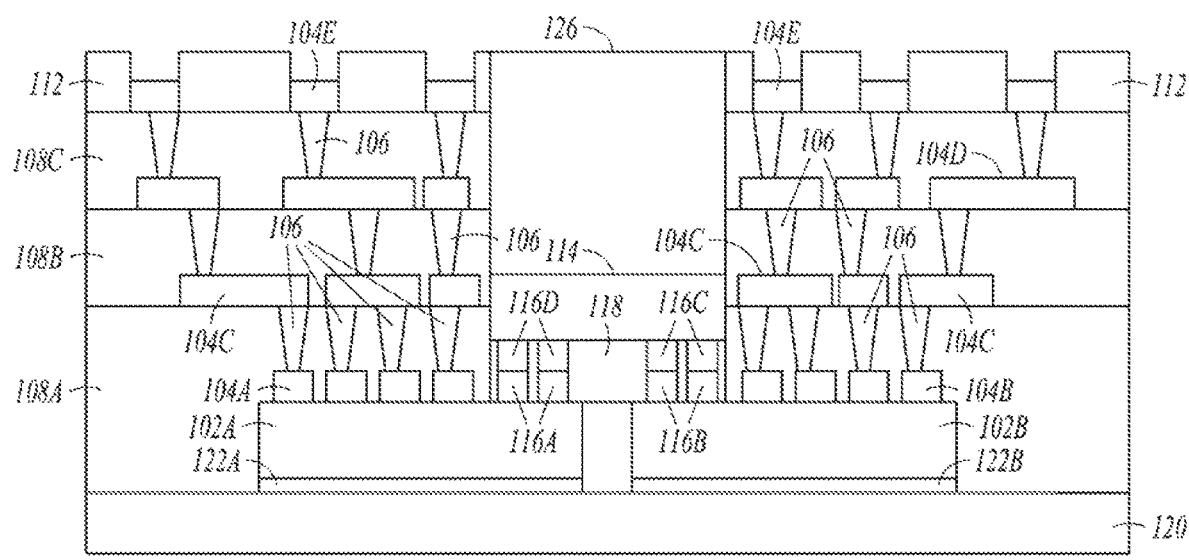
Figure 5E:
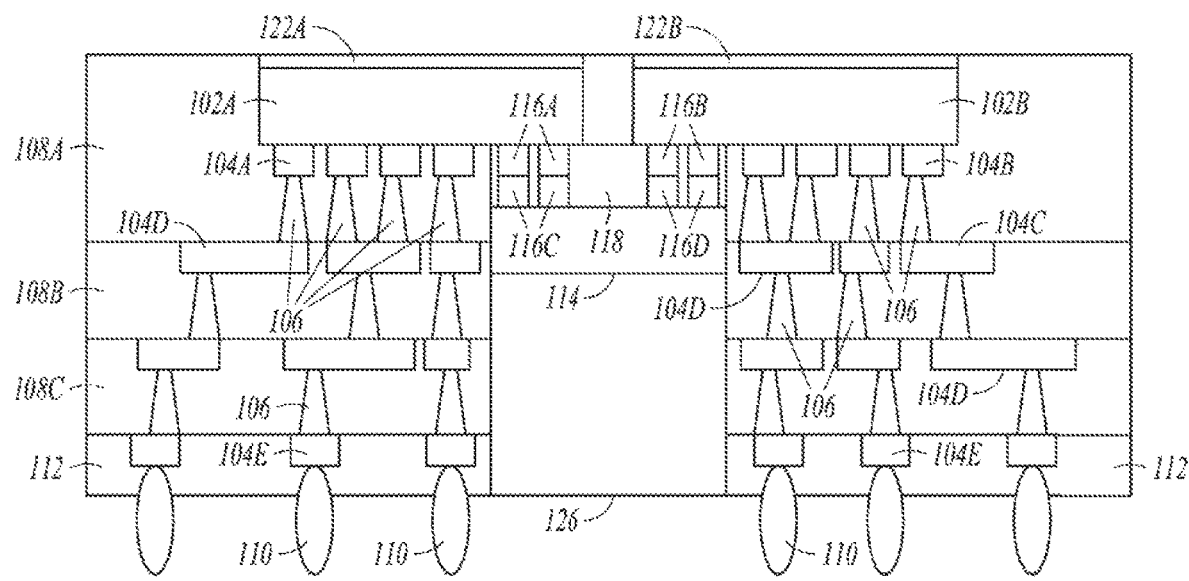

A high density interconnect element 114 can be situated in the cavity 128, such as to electrically couple the dice 102A-B. The high density interconnect element 114 can be coupled using an in situ epoxy TCB, an in situ capillary underfill TCB process, a solder ball attachment, or other process, such as shown in FIG. 5C. An encapsulant 126 (e.g., mold material, ajinomoto dielectric film (ABF), or epoxy, among others) can be situated over and around the high density interconnect element 114, such as shown in FIG. 5D. Portions of solder resist 112 covering low density interconnect pads 104E on the third buildup layer 108C can be removed. FIG. 5E shows the substrate depicted in FIG. 5D with solder balls 110 electrically coupled to low density interconnect pads 104E and the substrate carrier 120 removed.

Figure 6A:
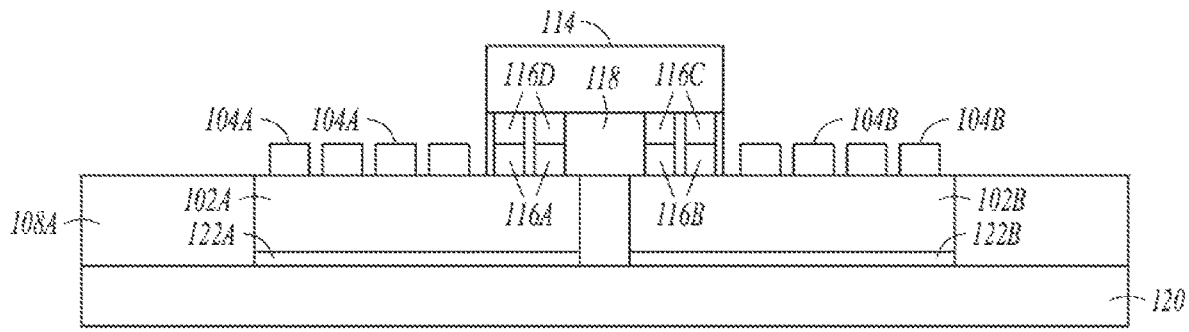
FIGS. 6A-6E show an example of another technique of making a BBUL substrate with two die electrically coupled through a high density interconnect.

FIGS. 6A-6E depict a technique of situating a high density interconnect element 114 in a BBUL substrate or package. The technique can begin with the partial substrate depicted in FIG. 4A. A first build layer 108A can be formed around the dice 102A-B and over or on the substrate carrier 120. The first buildup layer 108A can leave the low density interconnect pads 104A-B and the high density interconnect pads 116A-B exposed. A high density interconnect element 114 can be electrically coupled to the dice 102A-B, such as by using an in situ epoxy TCB or in situ capillary underfill TCB process, such as shown in FIG. 6A.

Figure 6B:
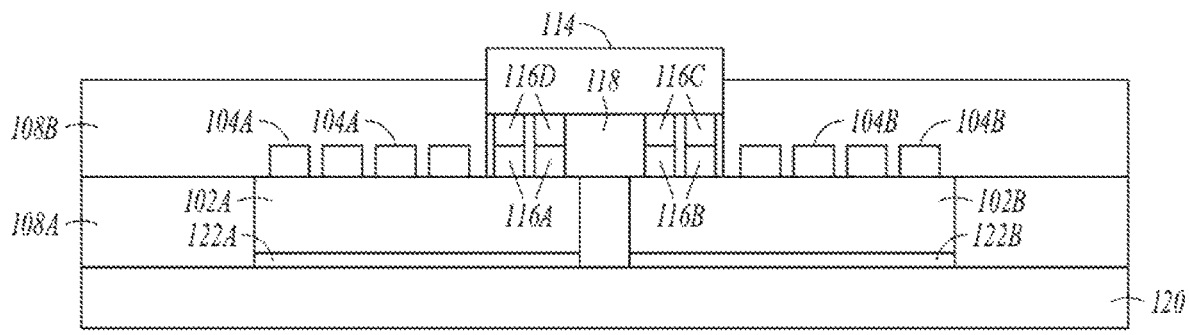

FIG. 6B shows a second buildup layer 108B formed on or over the first buildup layer 108A and around the high density interconnect element 114, the low density interconnect pads 104A-B, and the dielectric 118 (e.g., epoxy or capillary underfill). Via holes 124 can be formed in the second buildup layer 108B to expose low density interconnect pads 104A-B, such as shown in FIG. 6C.

Figure 6C:
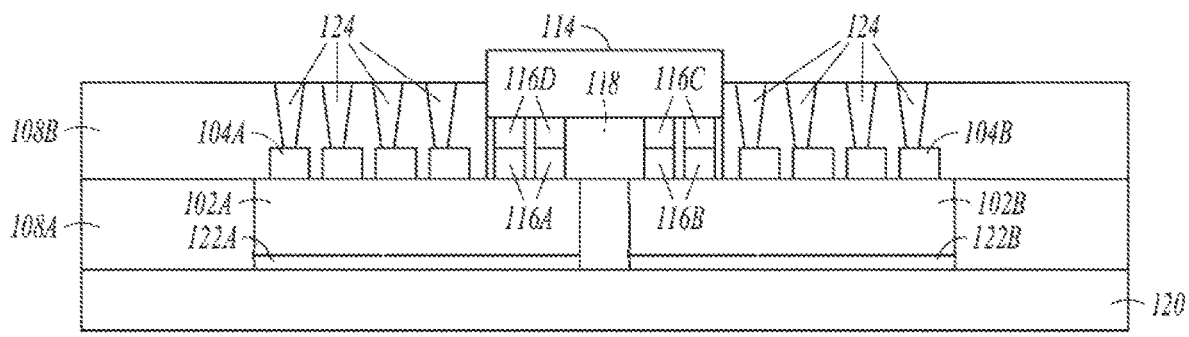
Figure 6D:
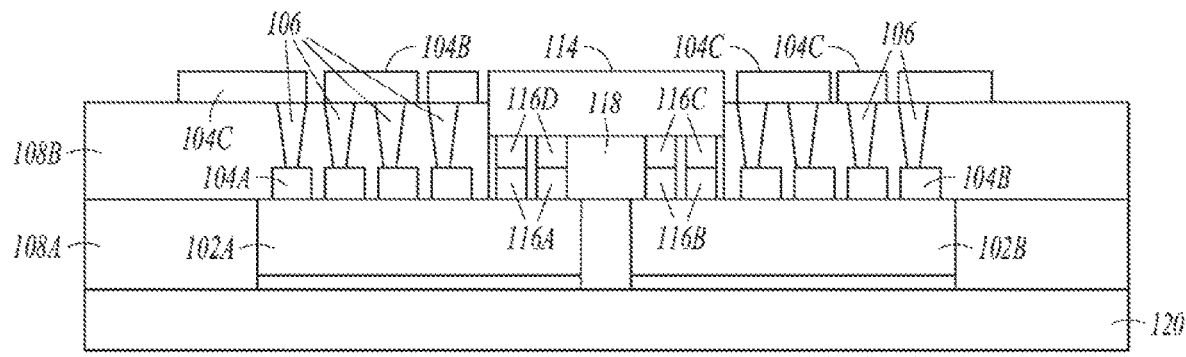
Figure 6E:
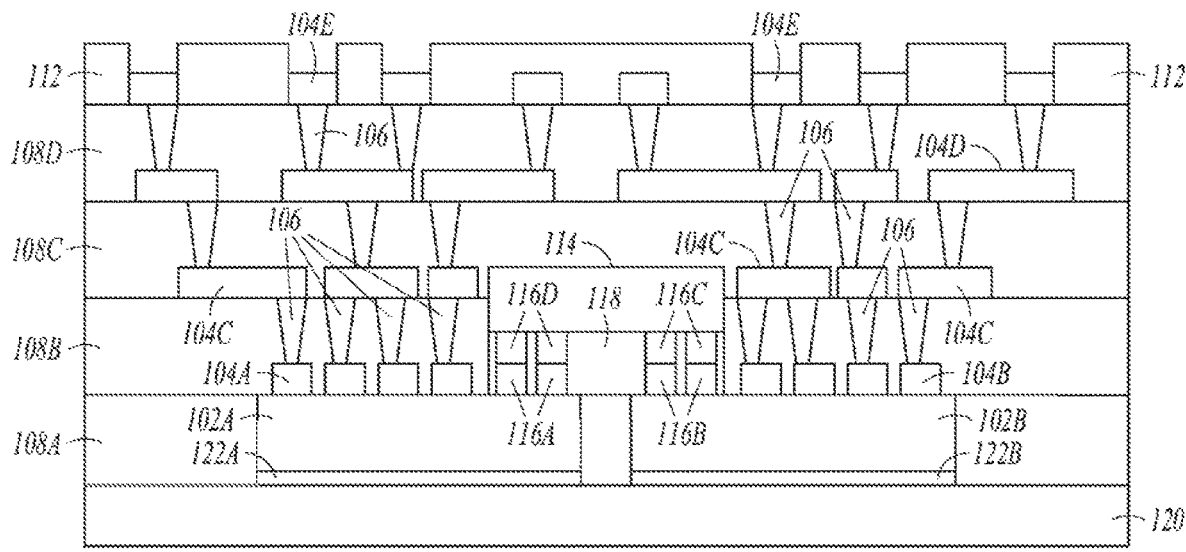

FIG. 6C shows the via holes 124 at least partially filled with a conductive material, such as copper, to form electrically conductive vias 106. Low density interconnect pads 104C can be situated on or over the vias 106. FIG. 6D shows third and fourth buildup layers 108C-D formed over the second buildup layer 108B and vias 106 formed the third and fourth buildup layers 108C-D. Low density interconnect pads 104D-E can be formed on the third and fourth buildup layers 108C-D, respectively. A layer of solder resist 112 can be formed on the fourth buildup layer 108D. Portions of solder resist 112 can be removed to expose one or more low density interconnect pads 104E. Solder balls 110 can be formed on the low density interconnect pads 104E and the substrate carrier 120 can be removed. The resulting package can be similar to the BBUL substrate 200, depicted in FIG. 2.

Figure 7:
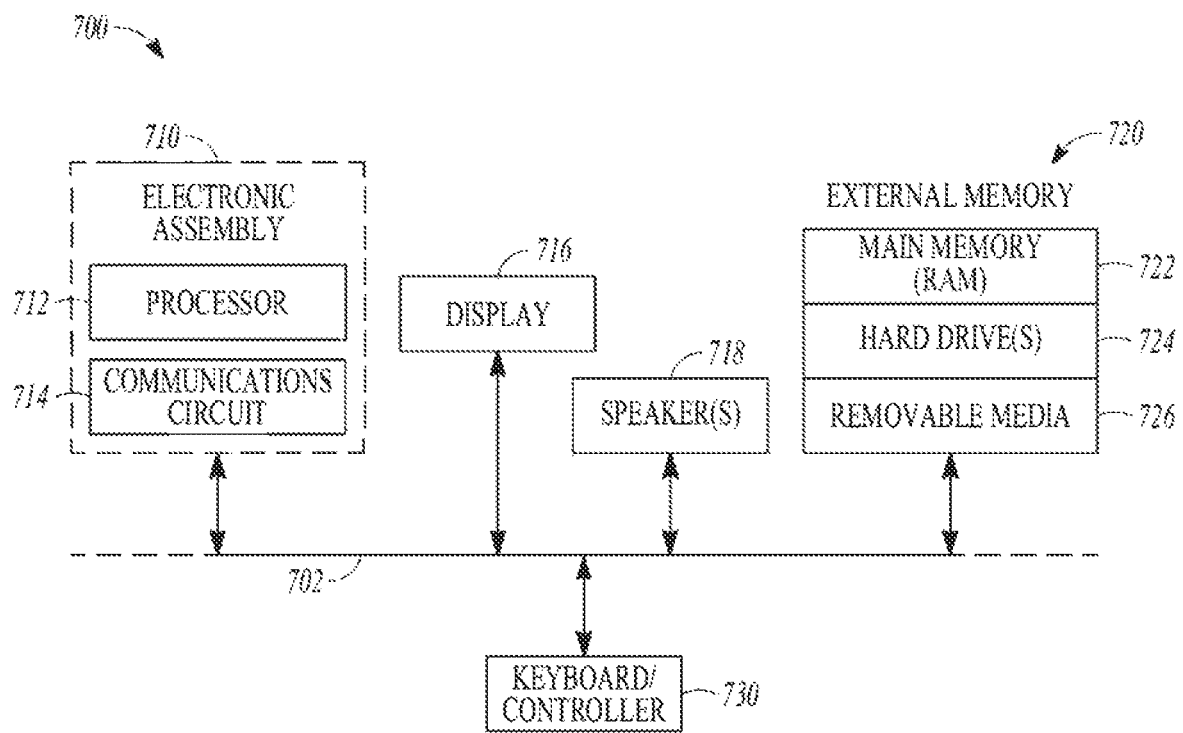
FIG. 7 shows a block diagram example of an electronic device which can include a BBUL substrate with two die electrically coupled through a high density interconnect.

An example of an electronic device using one or more BBUL substrates 200 or packages with one or more high density interconnect element 114 embedded therein is included to show an example of a device application for the present disclosure. FIG. 7 shows an example of an electronic device 700 incorporating one or more high density interconnect element(s) 114. Electronic device 700 is merely one example of a device in which embodiments of the present disclosure can be used. Examples of electronic devices 700 include, but are not limited to, personal computers, tablet computers, supercomputers, servers, telecommunications switches, routers, mobile telephones, personal data assistants, MP3 or other digital music players, radios, etc. In this example, electronic device 700 comprises a data processing system that includes a system bus 702 to couple the various components of the system. System bus 702 provides communications links among the various components of the electronic device 700 and can be implemented as a single bus, as a combination of busses, or in any other suitable manner.

An electronic assembly 710 is coupled to system bus 702. The electronic assembly 710 can include a circuit or combination of circuits. In one embodiment, the electronic assembly 710 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 710 are a custom circuit, an application-specific integrated circuit (ASIC), or the like, such as, for example, one or more circuits (such as a communications circuit 714) for use in wireless devices like mobile telephones, pagers, personal data assistants, portable computers, two-way radios, and similar electronic systems. The IC can perform any other type of function.

The electronic device 700 can include an external memory 720, which in turn can include one or more memory elements suitable to the particular application, such as a main memory 722 in the form of random access memory (RAM), one or more hard drives 724, and/or one or more drives that handle removable media 726 such as compact disks (CD), digital video disk (DVD), and the like.

The electronic device 700 can also include a display device 716, one or more speakers 718, and a keyboard and/or controller 730, which can include a mouse, trackball, touch screen, voice-recognition device, or any other device that permits a system user to input information into and receive information from the electronic device 700.

ADDITIONAL NOTES AND EXAMPLES

In Example 1 a method of making a BBUL substrate with a high density interconnect element embedded therein includes situating a first die including a first plurality of high density interconnect pads on a substrate carrier.

In Example 2, the method of Example 1 includes situating a second die including a second plurality of high density interconnect pads on the substrate carrier.

In Example 3, the method of at least one of Examples 1-2 includes forming a first buildup layer around and over the first and second dies.

In Example 4, the method of at least one of Examples 1-3 includes forming a cavity 128 in the buildup layer such that high density interconnect pads on the first and second dice are exposed.

In Example 5, the method of at least one of Examples 1~4 includes situating the high density interconnect element in the cavity.

In Example 6, situating first and second dice of at least one of Examples 1-5 includes situating a first die including a first plurality of low density interconnect pads and a second die including a second plurality of low density interconnect pads on the substrate carrier.

In Example 7, the method of at least one of Examples 1-6 includes forming a first plurality of via holes in the first buildup layer such that at least some of the first and second pluralities of low density interconnect pads on the first and second dice are exposed.

In Example 8, the method of at least one of Examples 1-7 includes at least partially filling the first plurality of via holes in the first buildup layer with conductive material.

In Example 9, the method of at least one of Examples 1-8 includes forming a third plurality of low density interconnect pads on the at least partially filled via holes.

In Example 10, the method of at least one of Examples 1-9 includes forming a second buildup layer on the first buildup layer and the third set of low density interconnect pads.

In Example 11, the method of at least one of Examples 1-10 includes forming a second plurality of via holes in the second buildup layer; and In Example 12, the method of at least one of Examples 1-11 includes at least partially filling the second plurality of via holes in the second buildup layer with conductive material.

In Example 13, the method of at least one of Examples 1-12 includes forming a fourth plurality of low density interconnect pads on the second plurality of via holes.

In Example 14, the method of at least one of Examples 1-13 includes situating solder resist over the second buildup layer.

In Example 15, the method of at least one of Examples 1-14 includes forming solder balls on the fourth plurality of low density interconnect pads.

In Example 16, forming the cavity in the buildup layer of at least one of Examples 1-15 includes sandblasting or laser ablating the buildup layer.

In Example 17, the method of at least one of Examples 1-16 includes filling the cavity with encapsulant.

In Example 18, situating the high density interconnect element in the cavity of at least one of Examples 1-17 includes electrically coupling high density interconnect pads on the high density interconnect element to the first and second pluralities of high density interconnect pads using an in situ capillary underfill or an in situ epoxy thermal compression bonding process.

In Example 19, a method of making a BBUL substrate with a high density interconnect element embedded therein includes situating a first die including a first plurality of high density interconnect pads on a substrate carrier.

In Example 20, the method of at least one of Examples 1-19 includes situating a second die including a second plurality of high density interconnect pads on the substrate carrier.

In Examples 21, the method of at least one of Examples 1-20 includes forming a first buildup layer around the first and second die and on the substrate carrier.

In Example 22, the method of at least one of Examples 1-21 includes situating the high density interconnect element on the first and second pluralities of high density interconnect pads.

In Example 23, the method of at least one of Examples 1-22 includes forming a second buildup layer over the first die, second die, and the first buildup layer.

In Example 24, the method of at least one of Examples 1-23 includes forming a first plurality of via holes in the second buildup layer.

In Example 25, the method of at least one of Examples 1-24 includes at least partially filling the first plurality of via holes with conductive material.

In Example 26, the method of at least one of Examples 1-25 includes forming a third plurality of low density interconnect pads over the at least partially filled first plurality of via holes.

In Example 27, the method of at least one of Examples 1-26 includes situating solder resist over the second buildup layer and around the third plurality of low density interconnect pads.

In Example 28, the method of at least one of Examples 1-27 includes forming solder balls on the third plurality of low density interconnect pads.

In Example 29, at least partially filling the first plurality of via holes with conductive material of at least one of Examples 1-28 includes at least partially filling the first plurality of via holes with copper.

In Examples 30, the method of at least one of Examples 1-29 includes removing the substrate carrier.

In Example 31, situating the high density interconnect element on the first and second pluralities of high density interconnect pads of at least one of Examples 1-32 includes electrically coupling high density interconnect pads on the high density interconnect element to the first and second dice using an in situ capillary underfill or an in situ epoxy thermal compression bonding process.

In Example 32 a device including a bumpless buildup layer (BBUL) substrate includes a first die at least partially embedded in the BBUL substrate, the first die including a first plurality of high density interconnect pads.

In Example 33, the device of at least one of Examples 1-32 includes a second die at least partially embedded in the BBUL substrate, the second die including a second plurality of high density interconnect pads.

In Example 34, the device of at least one of Examples 1-33 includes a high density interconnect element embedded in the BBUL substrate, the high density interconnect element including a third plurality of high density interconnect pads electrically coupled to the first and second plurality of high density interconnect pads.

In Example 35, the device of at least one of Examples 1-34 includes encapsulant on the high density interconnect element.

In Example 36, the device of at least one of Examples 1-35 includes at least one buildup layer formed over the high density interconnect element.

In Example 37, first and second die of at least one of Examples 1-36 are a logic die and an analog die, respectively.

In Example 38, the high density interconnect element of at least one of Examples 1-37 is a silicon die interconnect bridge or a glass die interconnect bridge.

In Example 39, the first die of at least one of Examples 1-38 includes a plurality of low density interconnect pads electrically connected to a bus of the BBUL substrate.

In Example 40, the second die of at least one of Examples 1-39 includes a plurality of low density interconnect pads electrically connected to the bus of the BBUL substrate.

In Example 41, the bus of at least one of Examples 1-40 is a power bus or a ground bus.

The above description of embodiments includes references to the accompanying drawings, which form a part of the description of embodiments. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above description of embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the description of embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A semiconductor package, comprising:
    a first die laterally spaced apart from a second die in a first dielectric layer;
    a high density interconnect structure beneath the first die and the second die, the high density interconnect structure comprising first interconnect pads, a first portion of the first interconnect pads coupled to the first die, and a second portion of the first interconnect pads coupled to the second die;
    a second dielectric layer beneath the first die and the second die and laterally adjacent to the high density interconnect structure;
    first through vias in the second dielectric layer, a first portion of the first through vias laterally spaced apart from a first side of the high density interconnect structure, and a second portion of the first through vias laterally spaced apart from a second side of the high density interconnect structure, the second side laterally opposite the first side;
    second interconnect pads beneath the first through vias, the first portion of the first through vias coupled to a first portion of the second interconnect pads, and the second portion of the first through vias coupled to a second portion of the second interconnect pads;
    a third dielectric layer beneath the second dielectric layer and beneath the high density interconnect structure;
    second through vias in the third dielectric layer, a first portion of the second through vias coupled to the first portion of the second interconnect pads, and a second portion of the second through vias coupled to the second portion of the second interconnect pads;
    third interconnect pads beneath the second through vias, the first portion of the second through vias coupled to a first portion of the third interconnect pads, and the second portion of the second through vias coupled to a second portion of the third interconnect pads;
    a fourth dielectric layer beneath the third dielectric layer;
    third through vias in the fourth dielectric layer, a first portion of the third through vias coupled to the first portion of the third interconnect pads, and a second portion of the third through vias coupled to the second portion of the third interconnect pads;
    fourth interconnect pads beneath the third through vias, the first portion of the third through vias coupled to a first portion of the fourth interconnect pads, and the second portion of the third through vias coupled to a second portion of the fourth interconnect pads; and
    solder structures coupled to the fourth interconnect pads.

2. The semiconductor package of claim 1, wherein the first die and the second die comprise low density interconnect pads and high density interconnect pads, the low density interconnect pads coupled to the first through vias, and the low density interconnect pads are coupled to the first interconnect pads of the high density interconnect structure.

3. The semiconductor package of claim 1, wherein the first die and the second die are processor dies.

4. The semiconductor package of claim 1, wherein the first dielectric layer, the second dielectric layer, the third dielectric layer and the fourth dielectric layer all have a same lateral width.

5. The semiconductor package of claim 1, wherein the first dielectric layer, the second dielectric layer, the third dielectric layer and the fourth dielectric layer all have edges in vertical alignment with one another.

6. The semiconductor package of claim 1, wherein the second dielectric layer is in contact with the first side and with the second side of the high density interconnect structure.

7. The semiconductor package of claim 1, wherein the second dielectric layer has a bottommost surface at a same level as a bottommost surface of the high density interconnect structure.

8. The semiconductor package of claim 1, wherein the second dielectric layer has a bottommost surface above a bottommost surface of the high density interconnect structure.

9. A semiconductor package, comprising:
- a first die laterally spaced apart from a second die in a first build-up layer;
- a high density interconnect structure beneath the first die and the second die, the high density interconnect structure comprising first interconnect pads, a first portion of the first interconnect pads coupled to the first die, and a second portion of the first interconnect pads coupled to the second die;
- a second build-up layer beneath the first die and the second die and laterally adjacent to the high density interconnect structure;
- first through vias in the second build-up layer, a first portion of the first through vias laterally spaced apart from a first side of the high density interconnect structure, and a second portion of the first through vias laterally spaced apart from a second side of the high density interconnect structure, the second side laterally opposite the first side;
- second interconnect pads beneath the first through vias, the first portion of the first through vias coupled to a first portion of the second interconnect pads, and the second portion of the first through vias coupled to a second portion of the second interconnect pads;
- a third build-up layer beneath the second build-up layer and beneath the high density interconnect structure;
- second through vias in the third build-up layer, a first portion of the second through vias coupled to the first portion of the second interconnect pads, and a second portion of the second through vias coupled to the second portion of the second interconnect pads;
- third interconnect pads beneath the second through vias, the first portion of the second through vias coupled to a first portion of the third interconnect pads, and the second portion of the second through vias coupled to a second portion of the third interconnect pads;
- a fourth build-up layer beneath the third build-up layer;
- third through vias in the fourth build-up layer, a first portion of the third through vias coupled to the first portion of the third interconnect pads, and a second portion of the third through vias coupled to the second portion of the third interconnect pads;
- fourth interconnect pads beneath the third through vias, the first portion of the third through vias coupled to a first portion of the fourth interconnect pads, and the second portion of the third through vias coupled to a second portion of the fourth interconnect pads; and
- solder structures coupled to the fourth interconnect pads.

10. The semiconductor package of claim 9, wherein the first die and the second die comprise low density interconnect pads and high density interconnect pads, the low density interconnect pads coupled to the first through vias, and the low density interconnect pads are coupled to the first interconnect pads of the high density interconnect structure.

11. The semiconductor package of claim 9, wherein the first die and the second die are processor dies.

12. The semiconductor package of claim 9, wherein the first build-up layer, the second build-up layer, the third build-up layer and the fourth build-up layer all have a same lateral width.

13. The semiconductor package of claim 9, wherein the first build-up layer, the second build-up layer, the third build-up layer and the fourth build-up layer all have edges in vertical alignment with one another.

14. The semiconductor package of claim 9, wherein the second build-up layer is in contact with the first side and with the second side of the high density interconnect structure.

15. The semiconductor package of claim 9, wherein the second build-up layer has a bottommost surface at a same level as a bottommost surface of the high density interconnect structure.

16. The semiconductor package of claim 9, wherein the second build-up layer has a bottommost surface above a bottommost surface of the high density interconnect structure.

17. A method of fabricating a semiconductor package, the method comprising:
- forming a first die laterally spaced apart from a second die in a first dielectric layer;
- providing a high density interconnect structure beneath the first die and the second die, the high density interconnect structure comprising first interconnect pads, a first portion of the first interconnect pads coupled to the first die, and a second portion of the first interconnect pads coupled to the second die;
- forming a second dielectric layer beneath the first die and the second die and laterally adjacent to the high density interconnect structure;
- forming first through vias in the second dielectric layer, a first portion of the first through vias laterally spaced apart from a first side of the high density interconnect structure, and a second portion of the first through vias laterally spaced apart from a second side of the high density interconnect structure, the second side laterally opposite the first side;
- forming second interconnect pads beneath the first through vias, the first portion of the first through vias coupled to a first portion of the second interconnect pads, and the second portion of the first through vias coupled to a second portion of the second interconnect pads;
- forming a third dielectric layer beneath the second dielectric layer and beneath the high density interconnect structure;
- forming second through vias in the third dielectric layer, a first portion of the second through vias coupled to the first portion of the second interconnect pads, and a second portion of the second through vias coupled to the second portion of the second interconnect pads;
- forming third interconnect pads beneath the second through vias, the first portion of the second through vias coupled to a first portion of the third interconnect pads, and the second portion of the second through vias coupled to a second portion of the third interconnect pads;
- forming a fourth dielectric layer beneath the third dielectric layer;
- forming third through vias in the fourth dielectric layer, a first portion of the third through vias coupled to the first portion of the third interconnect pads, and a second portion of the third through vias coupled to the second portion of the third interconnect pads;
- forming fourth interconnect pads beneath the third through vias, the first portion of the third through vias coupled to a first portion of the fourth interconnect pads, and the second portion of the third through vias coupled to a second portion of the fourth interconnect pads; and
- forming solder structures coupled to the fourth interconnect pads.

18. The method of claim 17, wherein the first die and the second die comprise low density interconnect pads and high density interconnect pads, the low density interconnect pads coupled to the first through vias, and the low density interconnect pads are coupled to the first interconnect pads of the high density interconnect structure.

19. The method of claim 17, wherein the first die and the second die are processor dies.

20. The method of claim 17, wherein the first dielectric layer, the second dielectric layer, the third dielectric layer and the fourth dielectric layer all have a same lateral width.

\* \* \* \* \*